United States Patent
Imamoto

(10) Patent No.: US 11,018,139 B2
(45) Date of Patent: May 25, 2021

(54) INTEGRATED TRANSISTORS AND METHODS OF FORMING INTEGRATED TRANSISTORS

(71) Applicant: Micron Technology, Inc., Boise, ID (US)

(72) Inventor: Takuya Imamoto, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/539,212

(22) Filed: Aug. 13, 2019

(65) Prior Publication Data
US 2021/0050354 A1    Feb. 18, 2021

(51) Int. Cl.
H01L 27/108    (2006.01)

(52) U.S. Cl.
CPC .. H01L 27/10873 (2013.01); H01L 27/10805 (2013.01); H01L 27/10885 (2013.01); H01L 27/10891 (2013.01)

(58) Field of Classification Search
CPC ......... H01L 27/10873; H01L 27/10805; H01L 27/10885; H01L 27/10891
USPC ....................................................... 257/296
See application file for complete search history.

(56) References Cited

U.S. PATENT DOCUMENTS

| | | | |
|---|---|---|---|
| 2010/0059827 A1* | 3/2010 | Oosuka | H01L 21/823878 257/369 |
| 2013/0065386 A1* | 3/2013 | Kim | H01L 29/7926 438/591 |
| 2015/0380504 A1* | 12/2015 | Nagai | H01L 29/4238 257/401 |
| 2016/0163603 A1* | 6/2016 | Bao | H01L 21/28167 257/412 |
| 2017/0162592 A1* | 6/2017 | Nishikawa | H01L 28/20 |
| 2017/0200719 A1* | 7/2017 | Bao | H01L 21/823828 |
| 2018/0358376 A1* | 12/2018 | Hwang | H01L 27/11556 |
| 2019/0189632 A1* | 6/2019 | Lee | H01L 27/1157 |

* cited by examiner

*Primary Examiner* — Dzung Tran
(74) *Attorney, Agent, or Firm* — Wells St. John P.S.

(57) ABSTRACT

Some embodiments include an integrated device having a first transistor gate over a first region of a semiconductor base, and having a second transistor gate over a second region of the semiconductor base. First sidewall spacers are along sidewalls of the first transistor gate. The first sidewall spacers include SiBNO, where the chemical formula lists primary constituents rather than a specific stoichiometry. The first sidewall spacers have a first thickness. Second sidewall spacers are along sidewalls of the second transistor gate. The second sidewall spacers have a second thickness which is less than the first thickness. First source/drain regions are within the semiconductor base and are operatively proximate the first transistor gate. Second source/drain regions are within the semiconductor base and are operatively proximate the second transistor gate. Some embodiments include methods of forming integrated devices.

14 Claims, 13 Drawing Sheets

INTEGRATED TRANSISTORS AND METHODS OF FORMING INTEGRATED TRANSISTORS

TECHNICAL FIELD

Integrated transistors and methods of forming integrated transistors. Integrated memory and associated circuitry.

BACKGROUND

Transistors may be utilized in integrated memory as access devices. Transistors may also be utilized in circuitry peripheral to the memory. For instances, the transistors may be incorporated into driver circuitry (e.g., wordline driver circuitry), sense amplifier circuitry, equalizer circuitry, column selection circuitry, etc.

An integrated device (e.g., a memory chip) may comprise the integrated memory and the integrated circuitry peripheral to the memory.

Some of the circuitry associated with the integrated device may be formed at a tighter pitch (a higher level of integration) than is other circuitry associated with the integrated device. Ideally, the transistors utilized within the tighter-pitched circuitry are scaled to have a smaller footprint as compared to the transistors utilized in the other (looser-pitched) circuitry. However, difficulties are encountered in efficiently forming transistors of different dimensions across an integrated device.

It would be desirable to develop new methods of forming transistors scaled to different dimensions across an integrated device.

DETAILED DESCRIPTION OF THE ILLUSTRATED EMBODIMENTS

Some embodiments include methods of incorporating SiBN (where the chemical formula indicates primary constituents rather than a specific stoichiometry) into sidewall spacers associated with transistors. The SiBN may be oxidized to form SiBNO (where the chemical formula indicates primary constituents rather than a specific stoichiometry). The SiBNO may be removed from the sidewall spacers of some transistors, and may be left within the sidewall spacers of other transistors. The selective removal of the SiBNO from the sidewall spacers of some transistors and not others may enable some of the transistors to be tailored for tightly-pitched applications while others of the transistors are tailored for more loosely-pitched applications. Example embodiments are described with reference to FIGS. 1-12.

Figure 1:
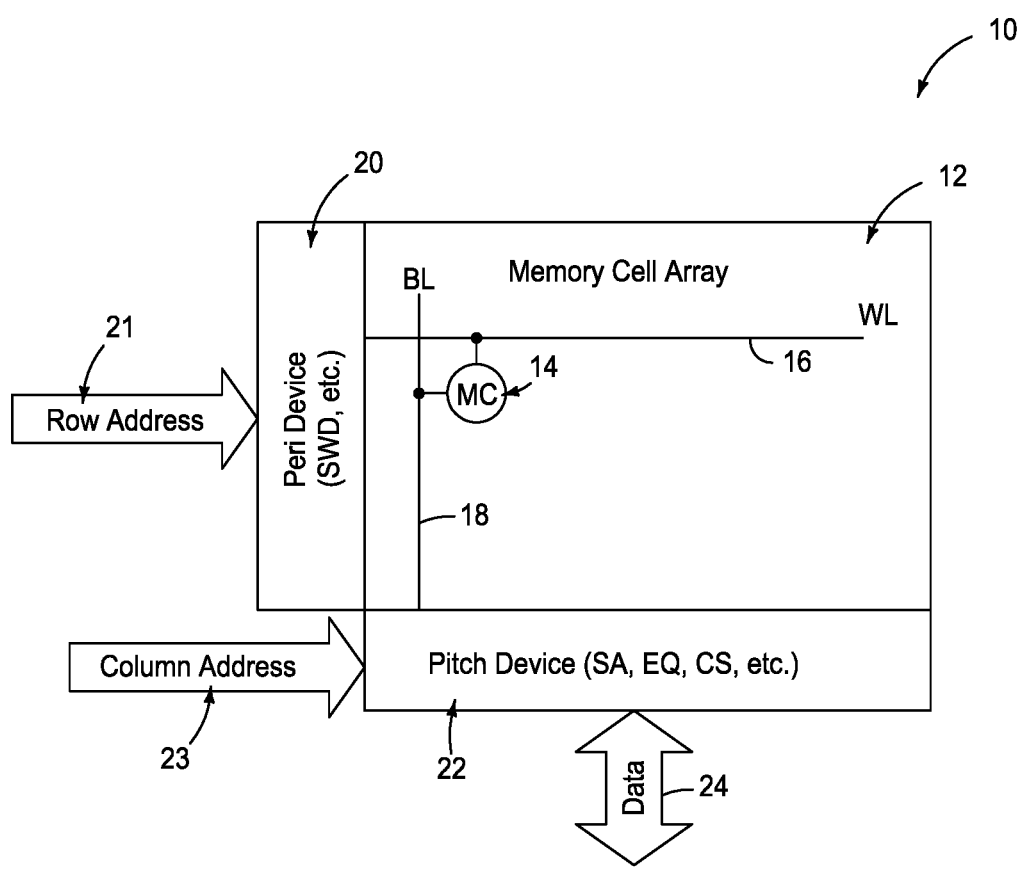
FIG. 1 is diagrammatic schematic view of regions of an integrated device.

Referring to FIG. 1, an integrated device 10 includes a Memory Cell Array (memory array) 12 having a plurality of memory cells (MC) 14. Only a single memory cell 14 is illustrated in FIG. 1 in order to signify the drawing, but it is to be understood that the memory array may comprise a large plurality of substantially identical memory cells; and in some embodiments may comprise hundreds, thousands, millions, hundreds of millions, etc., of memory cells. The term "substantially identical" means identical to within reasonable tolerances of fabrication and measurement. The memory cells may be one-transistor-one-capacitor (1T-1C) memory cells, or any other suitable memory cells; and in some embodiments may be incorporated into DRAM (dynamic random-access memory).

Wordlines (WL) 16 extend along the rows of the memory array, and bitlines (BL) 18 extend along the columns of the memory array. A single wordline 16 is illustrated in FIG. 1, and a single bitline 18 is illustrated in the figure. However, it is to be understood that there may be a large plurality of wordlines and bitlines extending across the memory array. Each of the memory cells 14 may be uniquely addressed by a combination of one of the wordlines 16 and one of the bitlines 18.

A first region 20 is proximate the memory array 12, and the wordlines 16 extend to circuitry within the first region 20. Such circuitry may include wordline circuitry (WD), logic circuitry, etc.; with the drivers being described as SWD in FIG. 1 to indicate that they may comprise sub-circuits (i.e., sub-wordline drivers). The first region 20 is coupled to receive Row Address 21.

A second region 22 is proximate the memory array 12, and the bitlines 18 extend to circuitry within the second region 22. Such circuitry may include sense amplifier circuitry (SA), equalizer circuitry (EQ), column select circuitry (CS), etc. The second region 22 is electrically coupled to receive Column Address 23. Data 24 may be transferred to and from the memory cell array 12 through the circuitry 22.

The bitlines 18 may be arranged on a pitch which is smaller than that of the wordlines 16 (i.e., which is tighter than the pitch of the wordlines 16). Accordingly, the devices of the region 22 may be on a pitch which is tighter than the pitch of the devices of the region 20. FIG. 1 shows the devices of the region 22 being referred to as Pitch Devices, while the devices of the region 20 are referred to as Peri Devices (peripheral devices). The terms "Pitch Devices" and "Peri Devices" are utilized to distinguish the devices of regions 22 and 20 from one another. The Peri Devices of region 20 may comprise first transistors (not shown in FIG. 1), and the Pitch Devices of region 22 may comprise second transistors (not shown in FIG. 1). The second transistors may be formed on a tighter pitch than the first transistors.

Figure 2A:
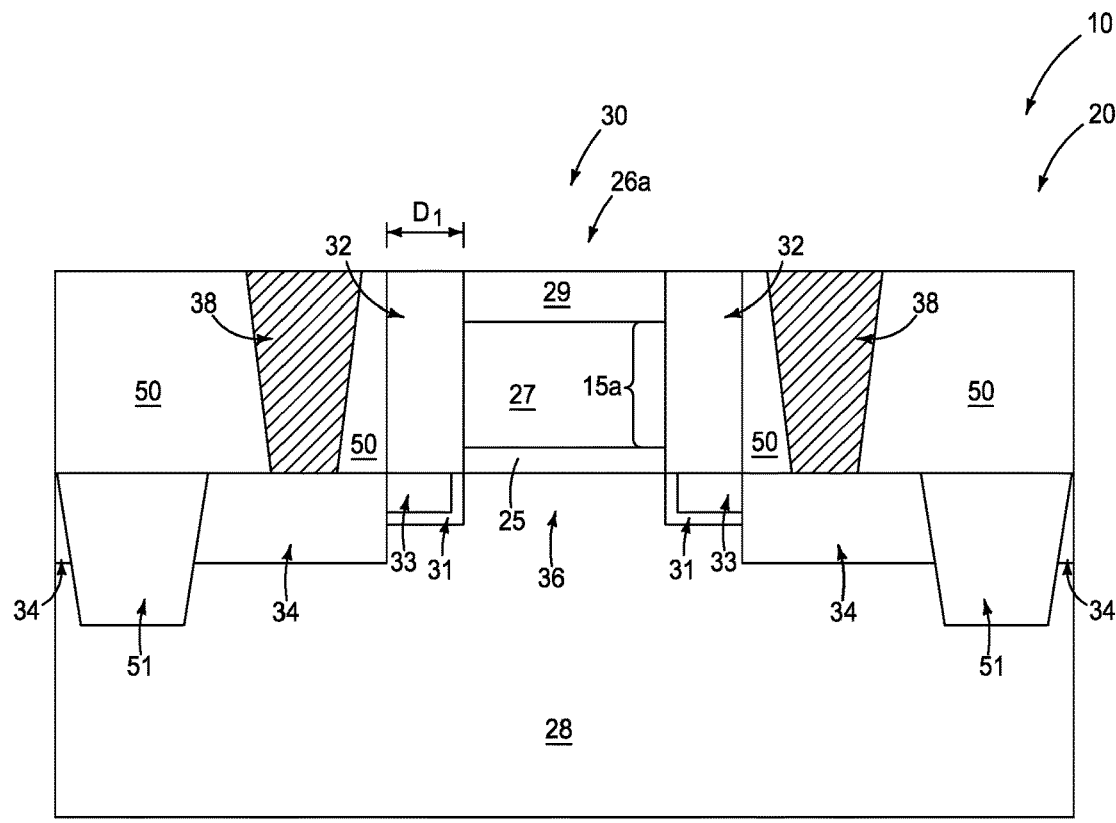
FIGS. 2A and 2B are diagrammatic cross-sectional side views of regions of an integrated device.
Figure 2B:
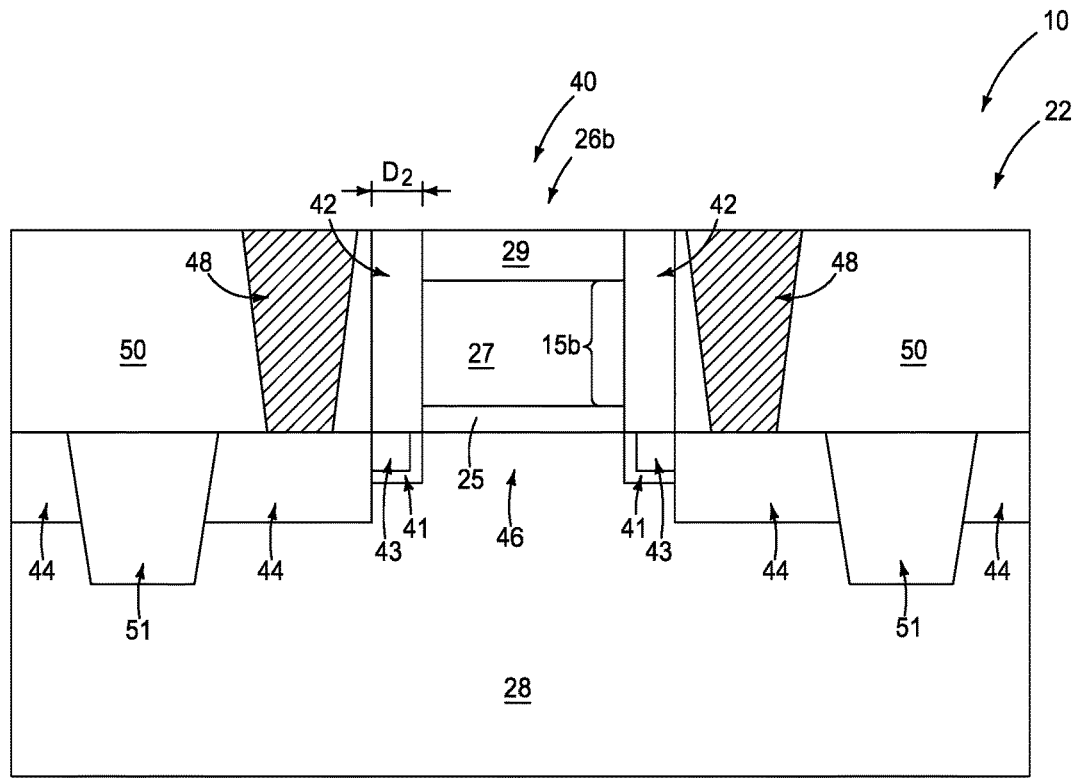

FIGS. 2A and 2B compare an example first transistor 30 associated with the first region 20 (shown in FIG. 2A) with an example second transistor 40 associated with the second region 22 (shown in FIG. 2B).

Each of the transistors 30 and 40 comprises a gate stack 26 (with the gate stack of the transistor 30 being labeled as a gate stack 26a, and the gate stack of the transistor 40 being labeled as a gate stack 26b). Each gate stack includes dielectric material 25, conductive gate material 27, and insulative capping material 29.

The dielectric material 25 may include, for example, one or more of silicon dioxide, silicon oxynitride, and one or more high-k materials (such as, for example, hafnium oxide, hafnium silicate, lanthanum oxide, aluminum oxide, etc.); where the term high-k means a dielectric constant greater than that of silicon dioxide.

The conductive gate material 27 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive gate material the comprise a region of conductively-doped semiconductor material (e.g., conductively-doped polycrystalline silicon, conductively-doped amorphous silicon, etc.), together with a metal-containing region (e.g., a region comprising tungsten). In some embodiments, a thin layer of metal-containing material may be provided at an interface between the conductive material 27 and the dielectric material 25 (e.g., a thin layer comprising one or more of titanium aluminum nitride, tantalum nitride, titanium nitride, etc.), and the dielectric material 25 may include high-k material, so that the transistors 30 and 40 are high-k metal gate (HKMG) transistors.

The insulative capping material 29 may comprise any suitable composition(s); and in some embodiments may comprise, consist essentially of, or consist of silicon nitride.

The gate stacks 26a and 26b are supported over a semiconductor base 28. The base 28 may comprise semiconductor material; and may, for example, comprise, consist essentially of, or consist of monocrystalline silicon. The base 28 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 28 may correspond to a semiconductor substrate containing one or materials associated with integrated circuit fabrication. Such materials may include, for example, one or more of refractory metal materials, barrier materials, diffusion materials, insulator materials, etc.

The base 28 may extend across an entirety of the integrated device 10. The region 20 may be considered to correspond to a first region of the base 28, and the region 22 may be considered to correspond to a second region of the base 28. The memory array 12 (FIG. 1) may be considered to be along a third region (or memory region) of the base 28.

The transistor 30 has first spacers 32 along the sidewalls of gate stack 26a, with such first spacers having a first thickness $D_1$. The first spacers 32 may comprise any suitable materials, with example materials being described below with reference to FIGS. 3-12.

The transistor 40 has second spacers 42 along the sidewalls of the gate stack 26b, with such second spacers having a second thickness $D_2$. The second spacers may comprise any suitable materials, with example materials being described below with reference to FIGS. 3-12.

The transistor 30 comprises first source/drain regions 34 which extend into the base 28, and which are proximate the spacers 32. The transistor 30 also comprises halo implant regions 31 and LDD (lightly doped diffusion) implant regions 33 under the spacers 32 and within the base 28.

The halo regions 31 will comprise an opposite-type conductivity-enhancing dopant as compared to the LDD regions 33. Specifically, in some embodiments the halo regions 31 will be p-type while the LDD regions 33 are n-type, and in other embodiments the halo regions will be n-type while the LDD regions are p-type. The halo regions 31 and the LDD regions 33 are generally lightly doped with conductivity-enhancing dopant; and specifically may be doped to concentrations less than or equal to about $10^{19}$ atoms/cm$^3$ with conductivity-enhancing dopant.

The source/drain regions 34 may be a same conductivity type as the LDD regions 33 and an opposite conductivity type relative to the halo regions 31. The source/drain regions 34 may be heavily-doped with suitable conductivity-enhancing dopant. The heavy doping may correspond to doping to a concentration of at least about $10^{20}$ atoms/cm$^3$. Example conductivity-enhancing dopants include boron, phosphorus, arsenic, etc.

The transistor 40 comprises second source/drain regions 44 which extend into the base 28, and which are proximate the spacers 42; and comprises halo implant regions 41 and LDD (lightly doped diffusion) implant regions 43 under the spacers 42.

The halo regions and the LDD regions (31, 33, 41 and 43) may alleviate short-channel effects.

The first transistor 30 comprises a first channel region 36 under the gate stack 26a, and between the source/drain regions 34; and similarly the second transistor 40 comprises a second channel region 46 under the gate stack 26b and between the source/drain regions 44.

The gate stack 26a may be considered to comprise a first transistor gate 15a corresponding to the conductive material of the gate stack 26a. In operation, sufficient voltage applied to the gate 15a will induce an electric field which enables current flow through the channel region 36 to electrically couple the source/drain regions 34 with one another. If the voltage to the gate is below a threshold level, the current will not flow through the channel region 36, and the source/drain regions 34 will not be electrically coupled with one another. The selective control of the coupling/decoupling of the source/drain regions 34 through the level of voltage applied to the gate may be referred to as gated coupling of the source/drain regions. In other words, the source/drain regions 34 of the transistor 30 may be considered to be gatedly coupled to one another through the channel region 36. Similarly, the source/drain regions 44 of the second transistor 40 may be considered to be gatedly coupled to one another through the channel region 46.

The first transistor 30 comprises the gate 15a, the source/drain regions 34, the halo regions 31, the LDD regions 33 and the channel region 36. In some embodiments, the source/drain regions 34, the LDD regions 33 and the halo regions 31 may be considered to be operatively adjacent the gate 15a, in that electrical flow through the regions 31, 33 and 34 may be controlled through operation of the gate 15a.

The second transistor 40 may be considered to comprise a second transistor gate 15b within the gate stack 26b, together with the source/drain regions 44, the halo regions 41, the LDD regions 43 and the channel region 46. In some embodiments, the source/drain regions 44, the LDD regions 43 and the halo regions 41 may be considered to be operatively adjacent the gate 15b, in that electrical flow through the regions 41, 43 and 44 may be controlled through operation of the gate 15b.

Isolation regions 51 extend into the base 28 to separate adjacent transistor devices from one another. The isolation regions 51 may comprise any suitable configuration(s), and in some embodiments may correspond to shallow trench isolation (STI). In some embodiments, the isolation regions 51 may comprise silicon dioxide, and may comprise a liner of silicon nitride between the silicon dioxide and the base 28.

An insulative mass 50 extends across the first and second regions 20 and 22. The insulative mass 50 may comprise any suitable composition(s); and in some embodiments may comprise, consist essentially of, or consist of silicon dioxide.

First electrical contacts (interconnects) 38 extend through the insulative mass 50 to electrically couple with the first source/drain regions 34, and second electrical contacts (interconnects) 48 extend through the insulative mass 50 to electrically couple with the source/drain regions 44. The electrical contacts 38 and 48 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

Notably, the thickness $D_2$ of the second spacers 42 of the tightly-pitched transistor 40 is less than the thickness $D_1$ of the first spacers 32 of the more loosely-pitched transistor 30. Such difference in thicknesses may enable advantages during formation and/or operation of the first and second transistors 30 and 40. For instance, the greater thickness of the spacers 32 of the more loosely-pitched transistor 30 of the region 20 may enable such transistor to be formed with greater spacing between the source/drain regions 34, which may alleviate short-channel effects. Further, the narrower spacers 42 of the more tightly-pitched transistor 44 may enable additional room to be available adjacent the gate stack 26b for the implant of the source/drain regions 44, and may provide additional spacing for formation of the interconnects 48.

Some embodiments include methods for efficiently fabricating the transistors 30 and 40 of the regions 20 and 22. Specifically, common materials may be utilized for the spacers 32 and 42 so that such spacers may be fabricated with common process steps. An example method is described with reference to FIGS. 3-12.

Figure 3A:
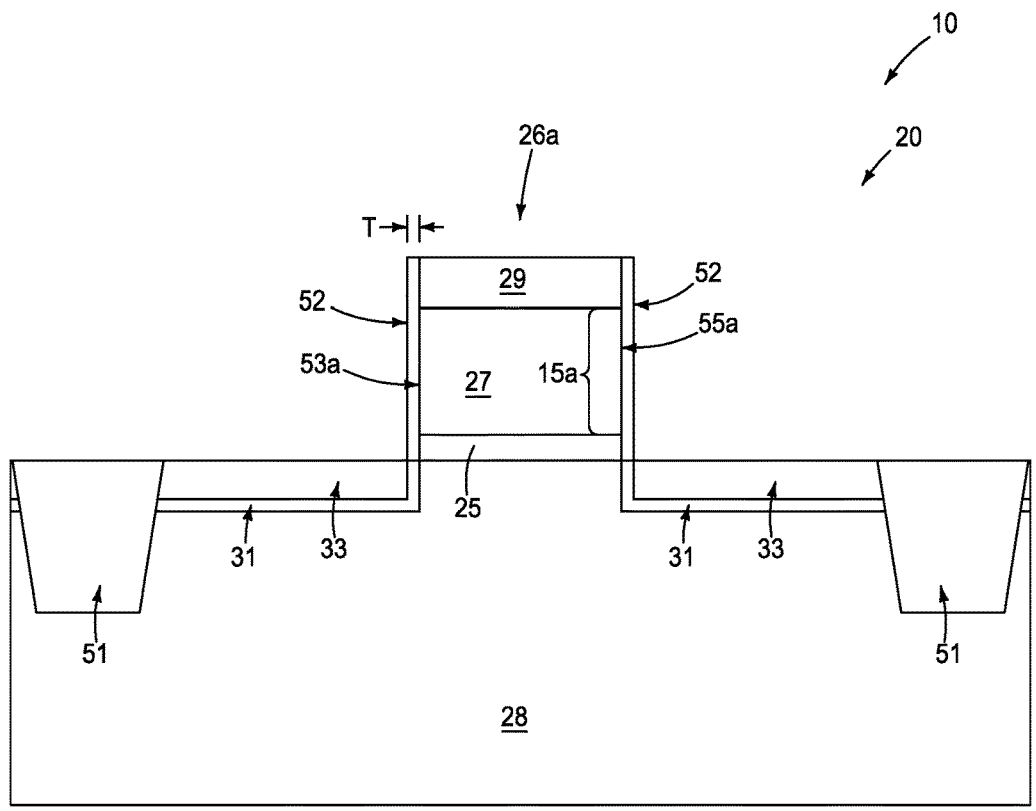
FIGS. 3A and 3B are diagrammatic cross-sectional side views of regions of an integrated device at an example process stage of an example method for forming example transistors.
Figure 3B:
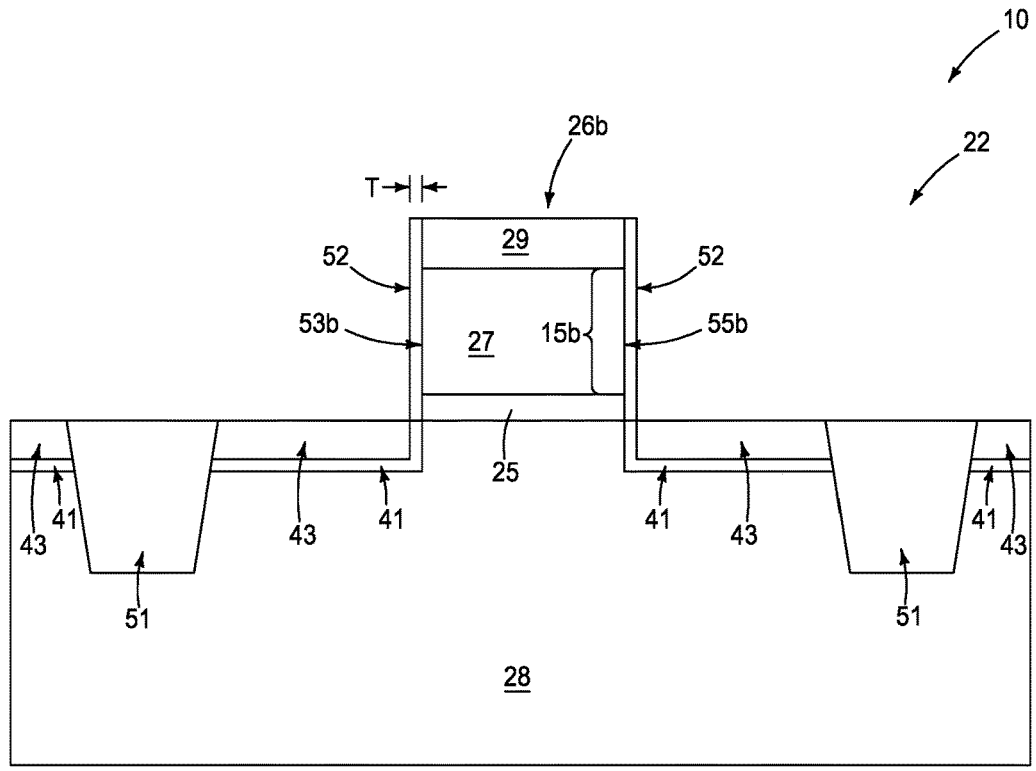

Referring to FIGS. 3A and 3B, the first and second gate stacks 26a and 26b are formed over the first and second regions 20 and 22 of the semiconductor base 28. The first and second gate stacks 26a and 26b comprise the first and second transistor gates 15a and 15b, respectively; with such transistor gates corresponding to the conductive materials (e.g., conductive materials 27) within the gate stacks.

The first gate stack 26a has sidewall surfaces 53a and 55a along the cross-section of FIG. 3A, and the second gate stack 26b has sidewall surfaces 53b and 55b along the cross-section of FIG. 3B.

Protective liners 52 are formed along the sidewalls 53a, 53b, 55a and 55b. The protective liners 52 may comprise any suitable composition(s); and in some embodiments may comprise, consist essentially of, or consist of silicon nitride. The protective liners 52 may protect the conductive material 27 along the sidewalls 53a, 53b, 55a and 55b from being oxidized or otherwise chemically modified during various process steps.

The protective liners 52 may be formed with any suitable processing. For instance, protective liner material may be formed to extend across the base 28, and over the gate stacks 26a and 26b; and subsequently such liner material may be anisotropically etched to form the liners 52.

The protective liners 52 may have any suitable thicknesses T; and in some embodiments such thicknesses may be within a range of from about 8 nanometers (nm) to about 12 nm.

The halo implant regions 31 and 41, and the LDD implant regions 33 and 43, may be formed subsequent to the formation of the protective liners 52 by implanting suitable dopants into the base 28 within the regions 20 and 22.

Figure 4A:
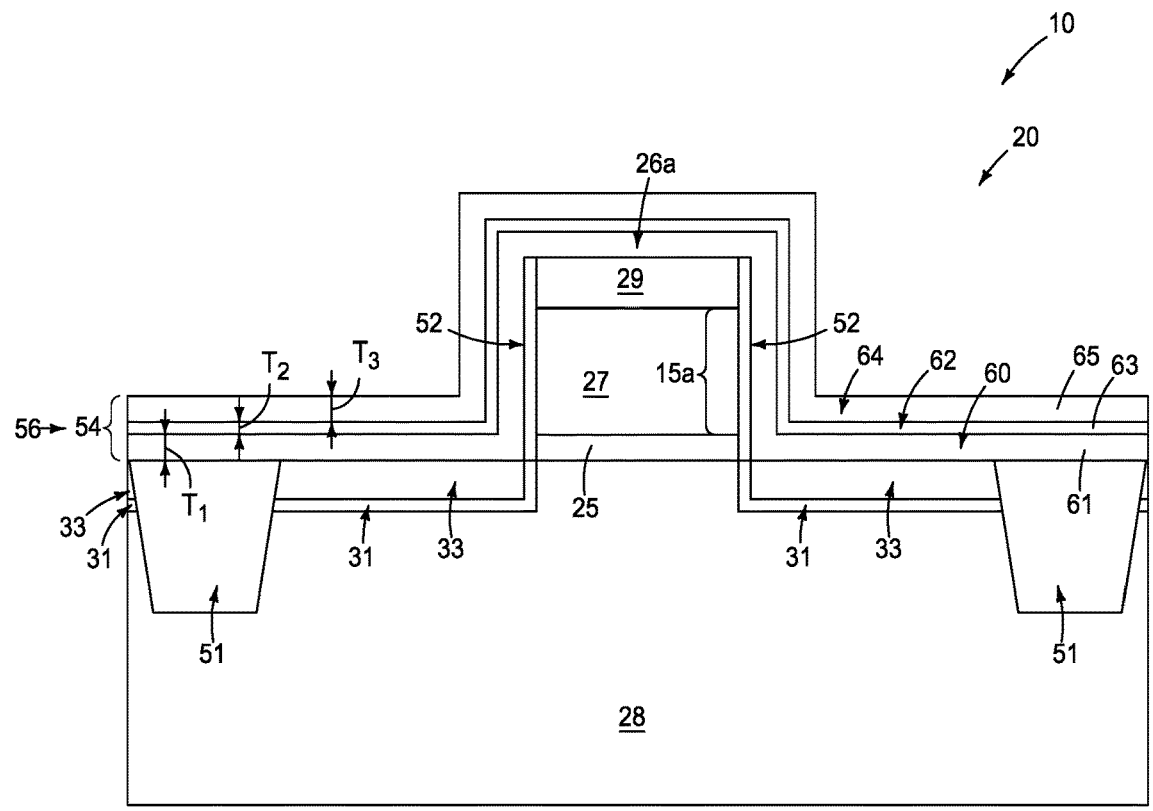
FIGS. 4A and 4B are diagrammatic cross-sectional side views of the regions of the integrated device of FIGS. 3A and 3B at an example process stage subsequent to that of FIGS. 3A and 3B.
Figure 4B:
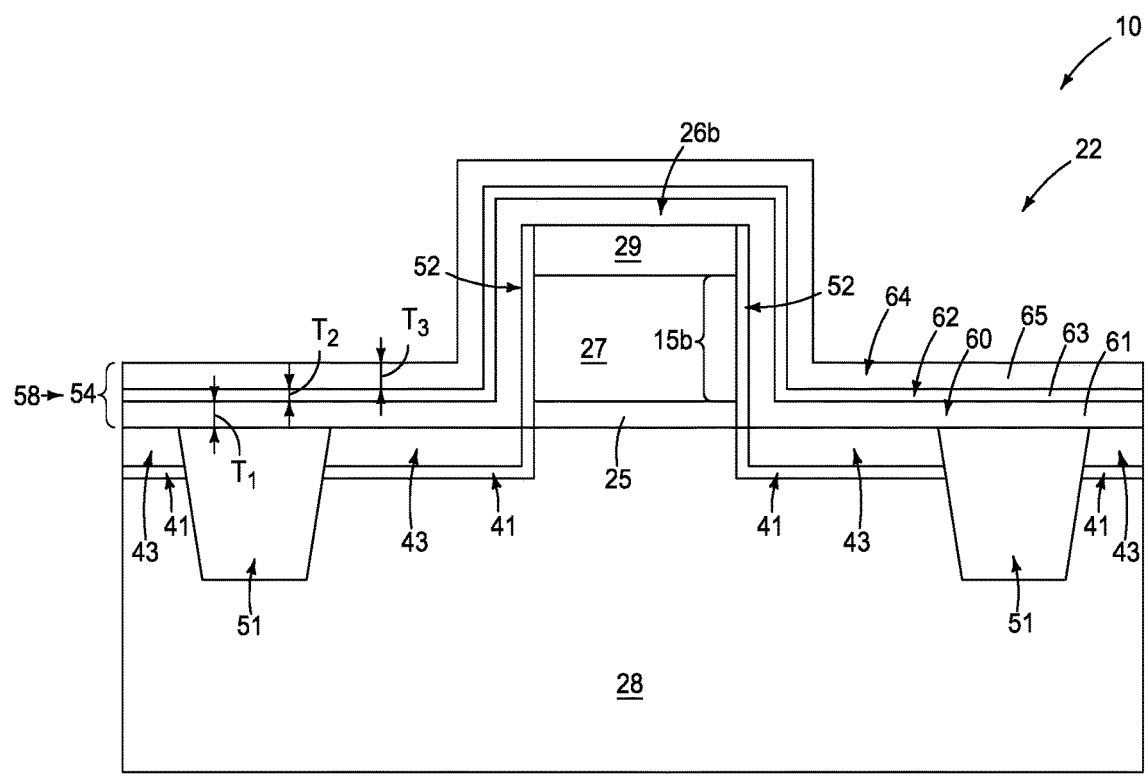

Referring to FIGS. 4A and 4B, a multilayer assembly 54 is formed to extend across the first and second regions 20 and 22 of the semiconductor base 28. The multilayer assembly 54 has a first portion 56 extending across the first region 20 of the semiconductor base 28. The first portion 56 extends over the first gate stack 26a. The multilayer assembly 54 has a second portion 58 extending across the second region 22 of the semiconductor base 28. The second portion 58 extends over the second gate stack 26b.

The illustrated multilayer assembly 54 comprises three layers 60, 62 and 64; which may be referred to as a first layer, a second layer and a third layer, respectively. The layers 60, 62 and 64 comprise materials 61, 63 and 65, respectively; which may be referred to as first, second and third materials. In some embodiments, the layers 60, 62 and 64 may be referred to as being formed one atop another, or as being formed one over the other. The layers 60, 62 and 64 may be formed with any suitable processing; such as, for example, one or more of atomic layer deposition (ALD), chemical vapor deposition (CVD), physical vapor deposition (PVD), etc.

In some embodiments, the third layer 64 may be referred to as an outer layer of the multilayer assembly 54, the first layer 60 may be referred to as an inner layer of the multilayer assembly, and the second layer 62 may be referred to as a middle layer of the multilayer assembly. In some embodiments, the second layer 62 may be referred to as being sandwiched between the first and third layers 60 and 64.

In some embodiments, the first and third materials 61 and 65 may comprise silicon (Si), boron (B) and nitrogen (N). The first and third materials may be referred to as comprising SiBN, where the chemical formula indicates primary constituents rather than a specific stoichiometry. In some embodiments, the concentration of boron within the materials 61 and 65 may be within a range of from about 20 atomic percent (at %) to about 30 at %. The ratio of silicon to nitrogen (Si:N) within the materials 61 and 65 may be within a range of from about 10:1 to about 1:10.

The second material 63 may comprise silicon and nitrogen (e.g., silicon nitride); and in some embodiments may be referred to as comprising SiN, where the chemical formula indicates primary constituents rather than a specific stoichiometry.

The layers 60, 62 and 64 may comprise any suitable thicknesses $T_1$, $T_2$ and $T_3$. In some embodiments, the thickness $T_1$ may be within a range of from about 10 nm to about 20 nm, the thickness $T_2$ may be within a range of from about 1 nm to about 2 nm, and the thickness $T_3$ may be within a range of from about 5 nm to about 12 nm. In some embodiments, the thickness $T_2$ may be less than or equal to about one-fifth of the thicknesses $T_1$ and $T_3$.

Figure 5A:
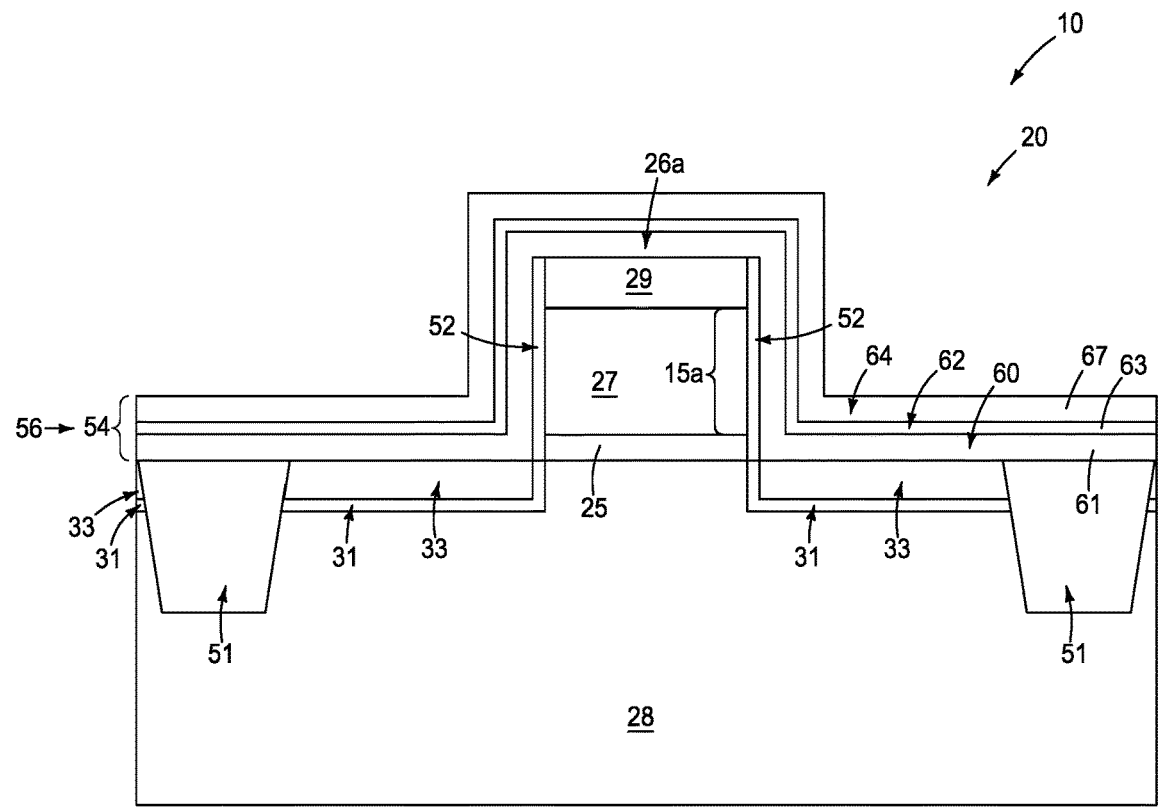
FIGS. 5A and 5B are diagrammatic cross-sectional side views of the regions of the integrated device of FIGS. 3A and 3B at an example process stage subsequent to that of FIGS. 4A and 4B.
Figure 5B:
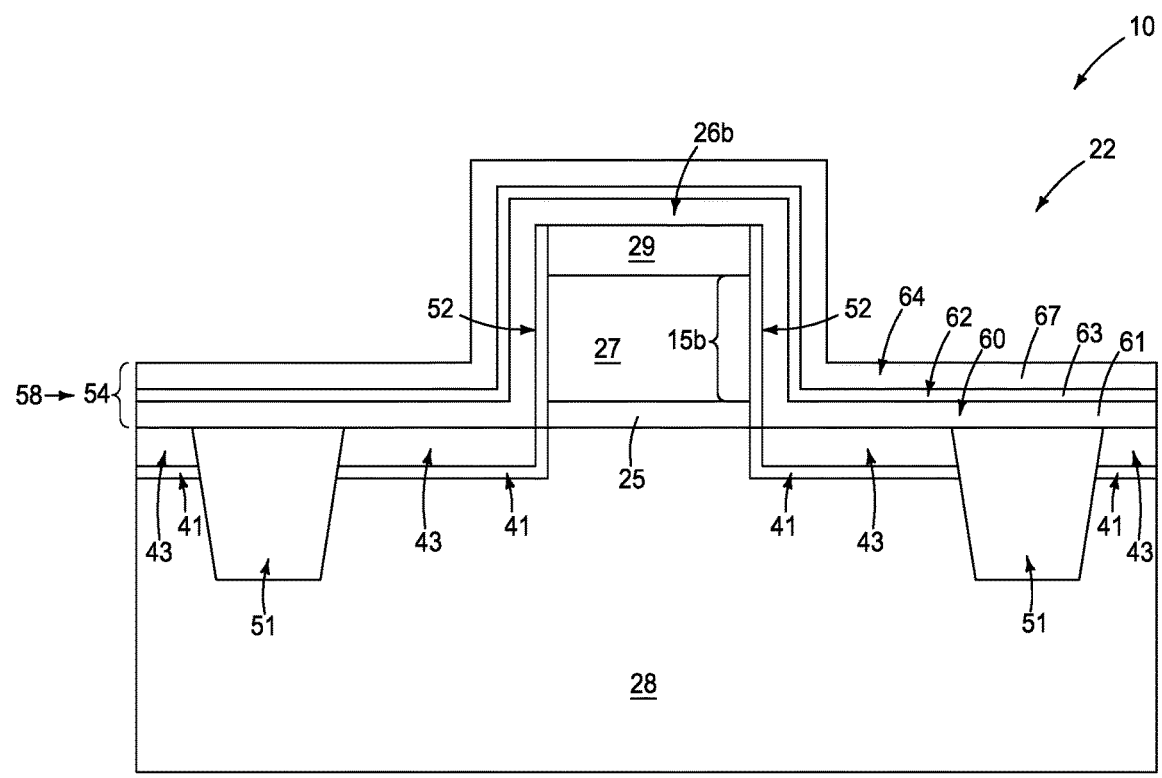

Referring to FIGS. 5A and 5B, the outer layer 64 is oxidized (i.e., subjected to ashing) to incorporate oxygen (O) into the outer layer. Such converts the outer layer to a material 67 comprising SiBNO, where the chemical formula indicates primary constituents rather than a specific stoichiometry. The ashing may convert an entirety of the SiBN of the outer layer 64 to SiBNO, or may convert only a portion of the SiBN of the outer layer 64 to the SiBNO. In some embodiments, the SiBNO comprises the boron to a concentration within a range of from about 20 at % to about 30 at %. The ratio of silicon to nitrogen (Si:N) within the SiBNO may be within a range of from about 10:1 to about 1:10. The amount of oxygen within the SiBNO may be greater than about 1 at %, greater than about 5 at %, greater than about 20 at %, greater than about 25 at %, etc.

The oxidation of the outer layer 64 may utilize any suitable conditions; and in some embodiments may utilize an oxygen plasma.

Figure 6A:
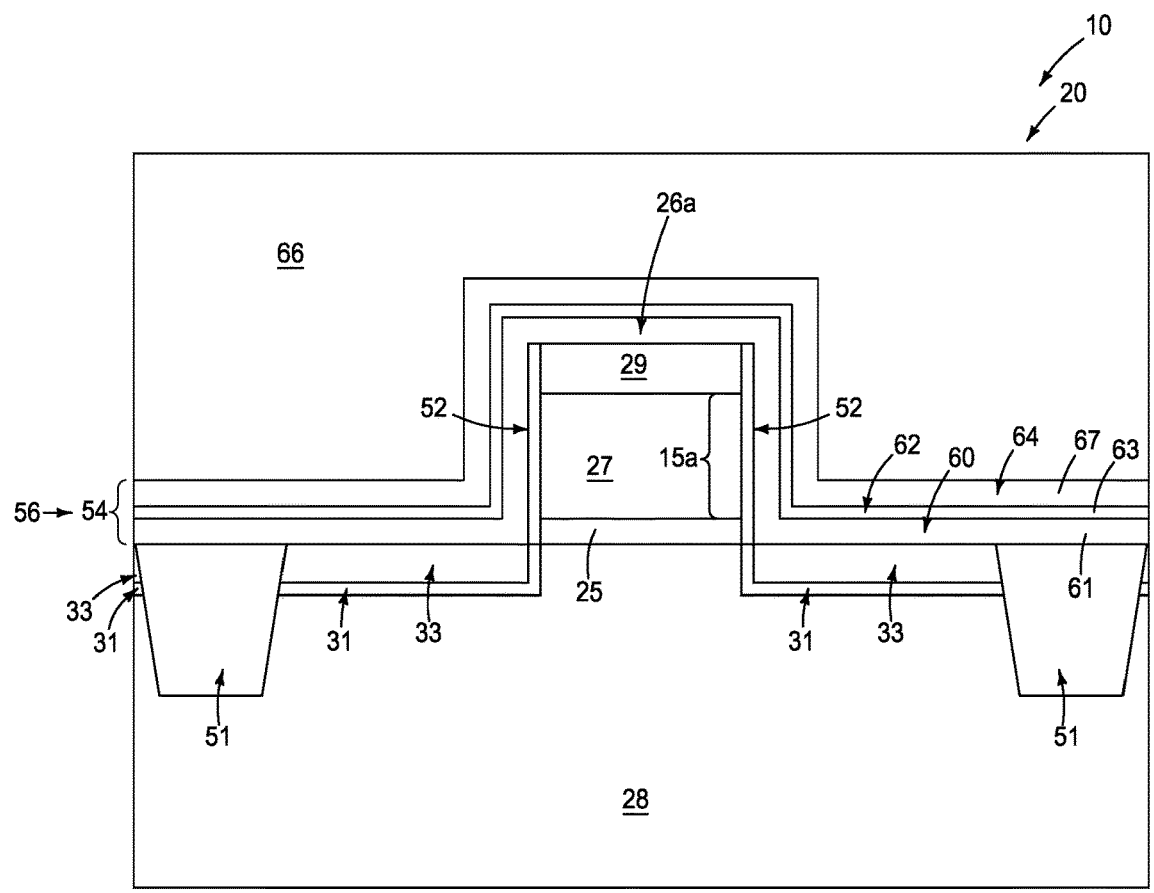
FIGS. 6A and 6B are diagrammatic cross-sectional side views of the regions of the integrated device of FIGS. 3A and 3B at an example process stage subsequent to that of FIGS. 5A and 5B.
Figure 6B:
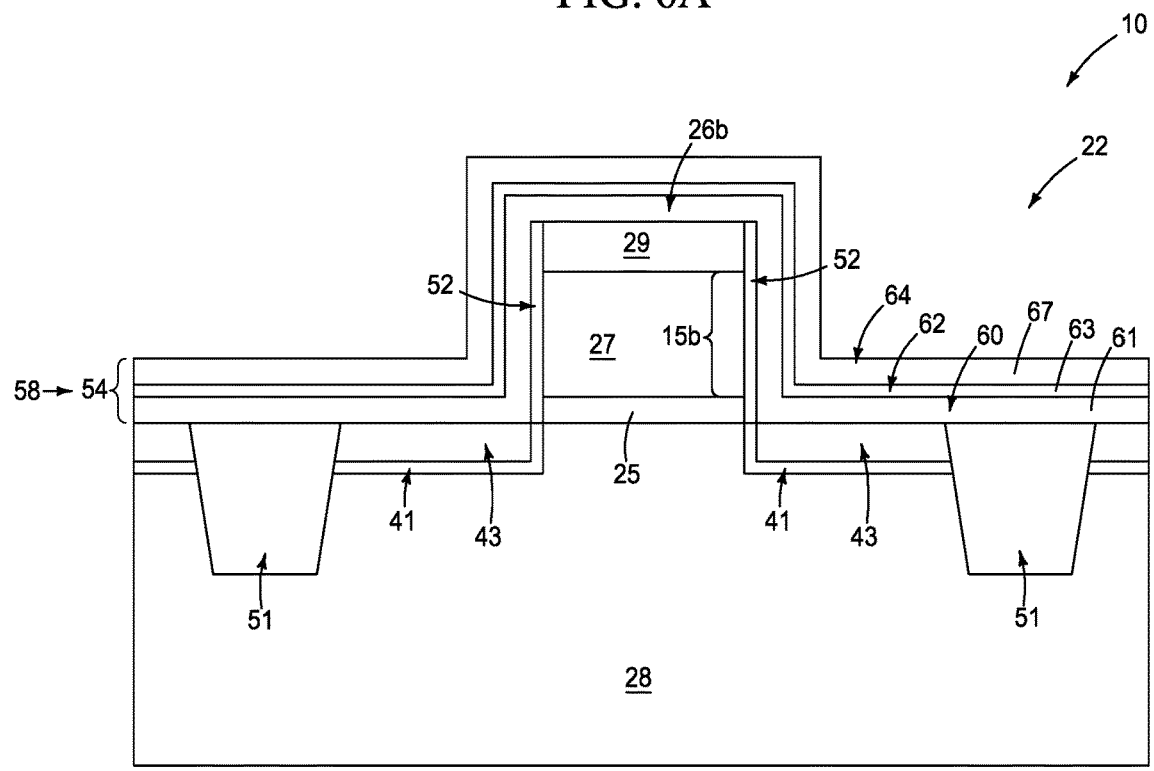

Referring to FIGS. 6A and 6B, a protective material 66 is formed over the first portion 56 of the multilayer assembly 54 (i.e., is formed over the portion of the multilayer assembly 54 associated with the first region 20 shown in FIG. 6A). The second portion 58 of the multilayer assembly 54 is not covered by the protective material 66, and instead remains exposed (with the second portion 58 of the multilayer assembly being the portion of the multilayer assembly 54 associated with the second region 22 of FIG. 6B).

The protective material 66 may comprise any suitable composition(s); and in some embodiments may comprise, consist essentially of, or consist of photolithographically-patterned photoresist.

Figure 7A:
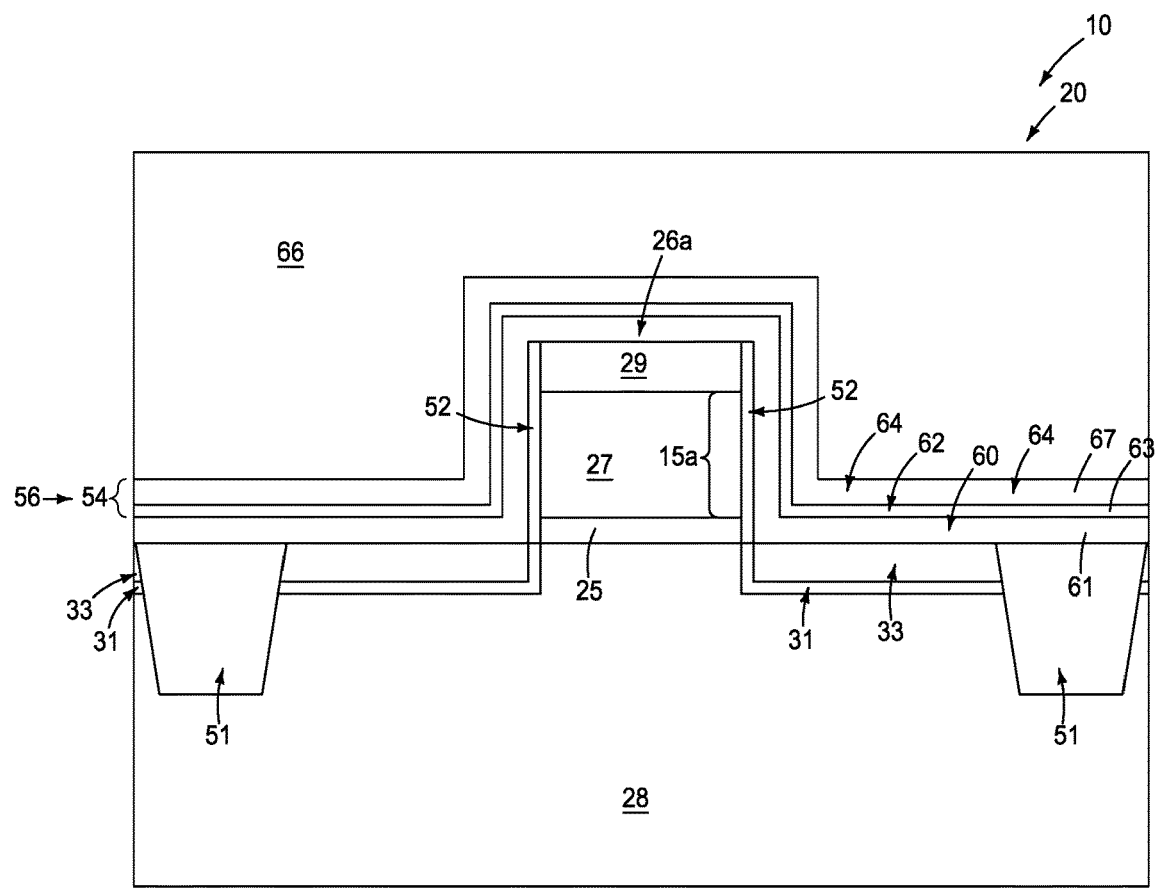
FIGS. 7A and 7B are diagrammatic cross-sectional side views of the regions of the integrated device of FIGS. 3A and 3B at an example process stage subsequent to that of FIGS. 6A and 6B.
Figure 7B:
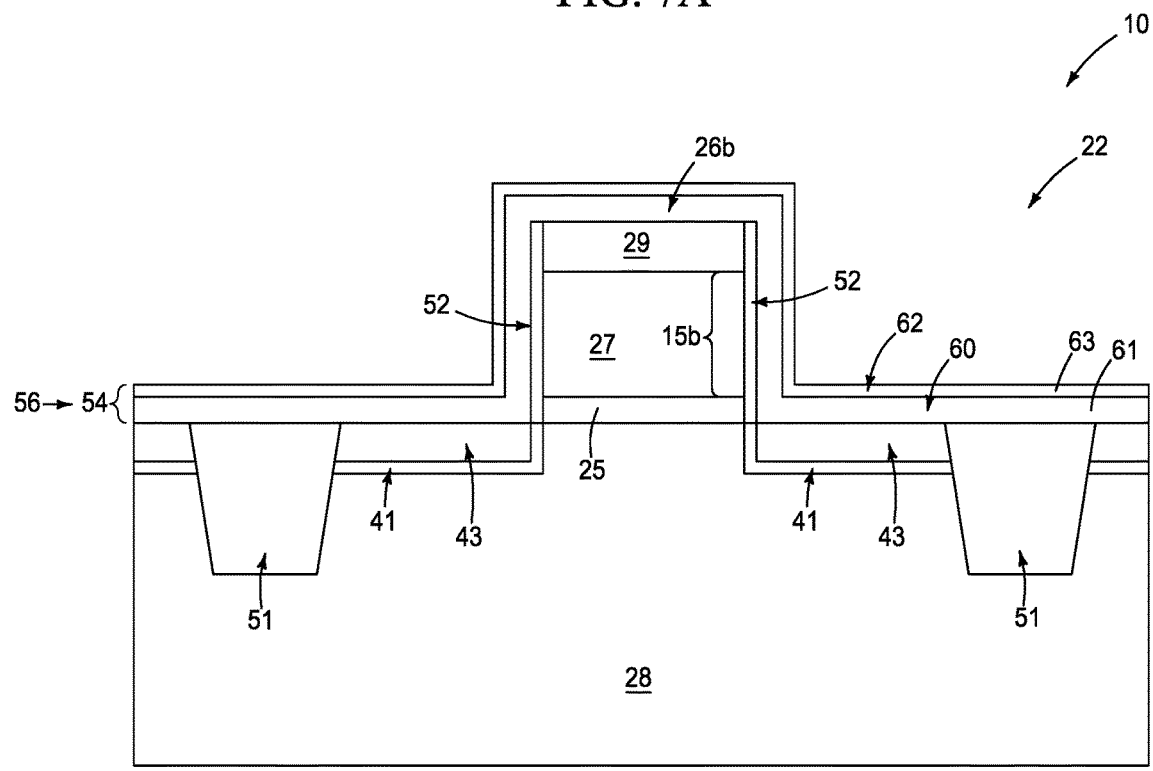

Referring to FIGS. 7A and 7B, the outer layer 64 of the multilayer assembly 54 is removed from the exposed second portion 58 (the portion within the region 22 shown in FIG. 7B) to thin the second portion 58 of the multilayer assembly 54. The removal of the outer layer 64 (i.e., the removal of the material 67) may be accomplished with any suitable processing. In some embodiments, the material 67 (the oxidized SiBN; or, in other words, the SiBNO) may be selectively removed relative to the silicon nitride (the material 63) of the layer 62 with wet etching utilizing dilute hydrofluoric acid (DHF), a combination of sulfuric acid and hydrogen peroxide (a so-called sulfuric/peroxide mix (SPM)), a buffered hydrofluoric acid (also referred to as a buffered oxide etch, BOE), etc. Example BOE compositions are available in the industry as LAL 30, LAL 800, etc. In some example embodiments, the wet etching may be conducted for a duration of from about 35 seconds to about 50 seconds. In some example embodiments, the DHF may comprise a ratio of commercially available hydrofluoric acid to water (HF:water) of from about 1:100 to about 1:500; where commercially available hydrofluoric acid may comprise an HF concentration within a range of from about 10% to about 49% in water (with the percentages referring to weight concentration, w/w %).

For purposes of interpreting this disclosure, etching conditions are considered to be selective for a first material relative to a second material if the etching conditions remove the first material faster than the second material, which can include, but is not limited to, etching conditions which are 100% selective for the first material relative to the second material.

In some embodiments, the SiBN may be only partially oxidized, and one or more of the above-described etchants (particularly the BOE and the DHF) may be utilized to selectively remove the oxidized SiBN relative to the non-oxidized SiBN. Also, in some embodiments there may be some exposed SiBN material 61 of the inner layer 60. In such embodiments, it may be preferable to utilize DHF or BOE instead of SPM. Specifically, the selectivity of SPM for SiBNO relative to SiBN may be less than that of DHF or BOE.

Figure 8A:
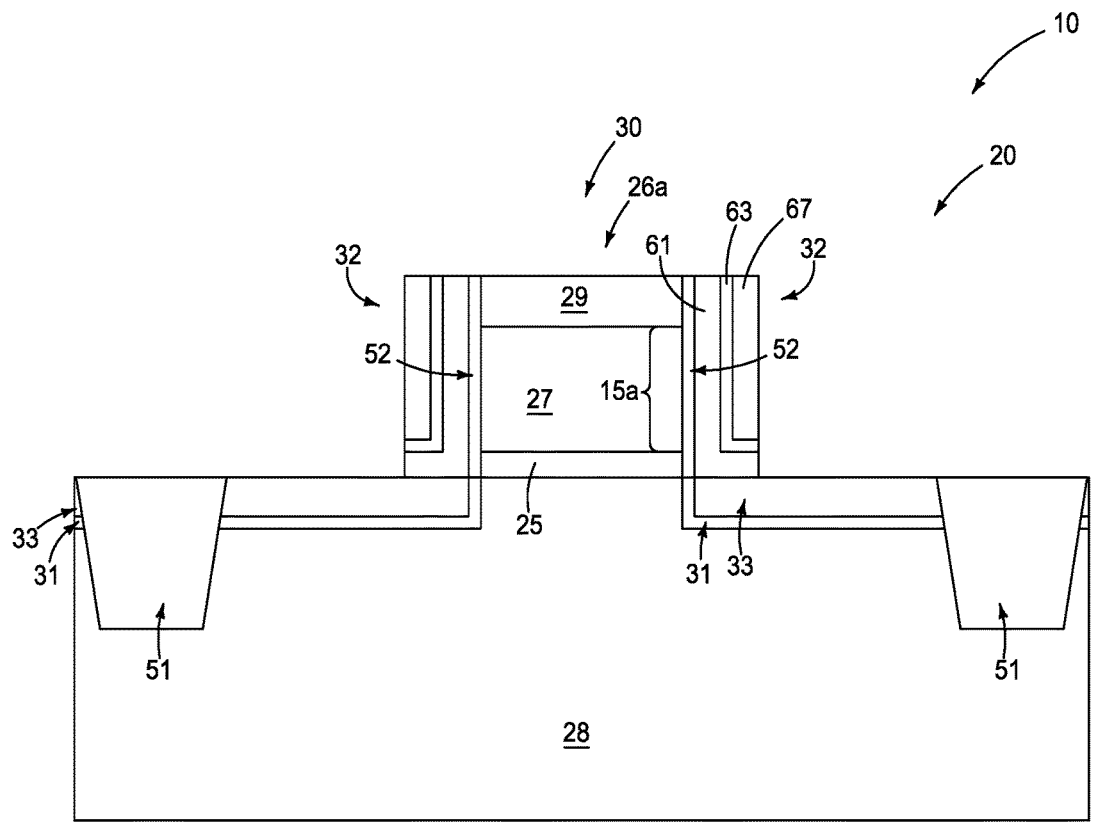
FIGS. 8A and 8B are diagrammatic cross-sectional side views of the regions of the integrated device of FIGS. 3A and 3B at an example process stage subsequent to that of FIGS. 7A and 7B.
Figure 8B:
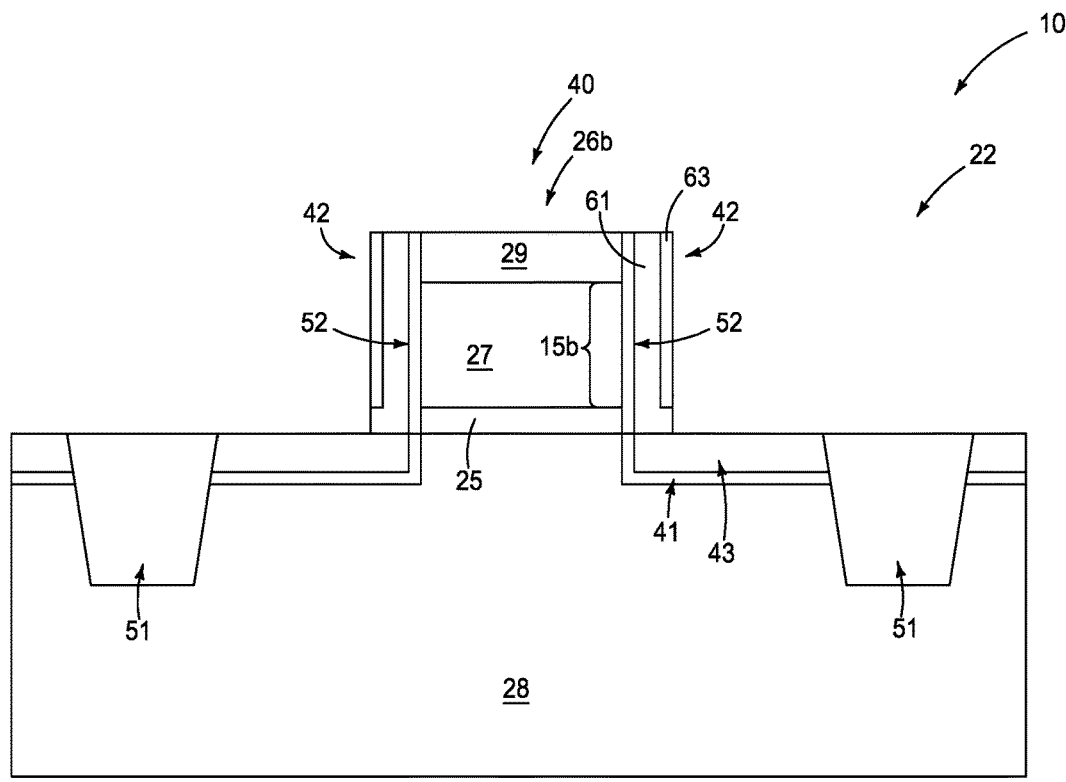

Referring to FIGS. 8A and 8B, the protective material 66 (FIG. 7A) is removed, and the first and second portions 56 and 58 of the multilayer assembly 54 (shown and labeled in FIGS. 7A and 7B) are anisotropically etched to form the first sidewall spacers 32 along the first gate stack 26a, and to form the second sidewall spacers 42 along the second gate stack 26b. In some embodiments, the first spacers 32 may be considered to comprise the SiN of the protective material 52, the SiBN of the material 61, the SiN of the material 63, and the SiBNO of the material 67; while the second spacers 42 may be considered to comprise the SiN of the protective material 52, the SiBN of the material 61 and the SiN of the material 63. Notably, the second spacers 42 are missing the material 67. Accordingly, the second spacers 42 are thinner than the first spacers 32.

The anisotropic etching utilized to form the spacers 32 and 42 may comprise any suitable processing conditions; and in some embodiments may comprise dry-etching with one or both of $CF_4$ and $CHF_3$.

Figure 9A:
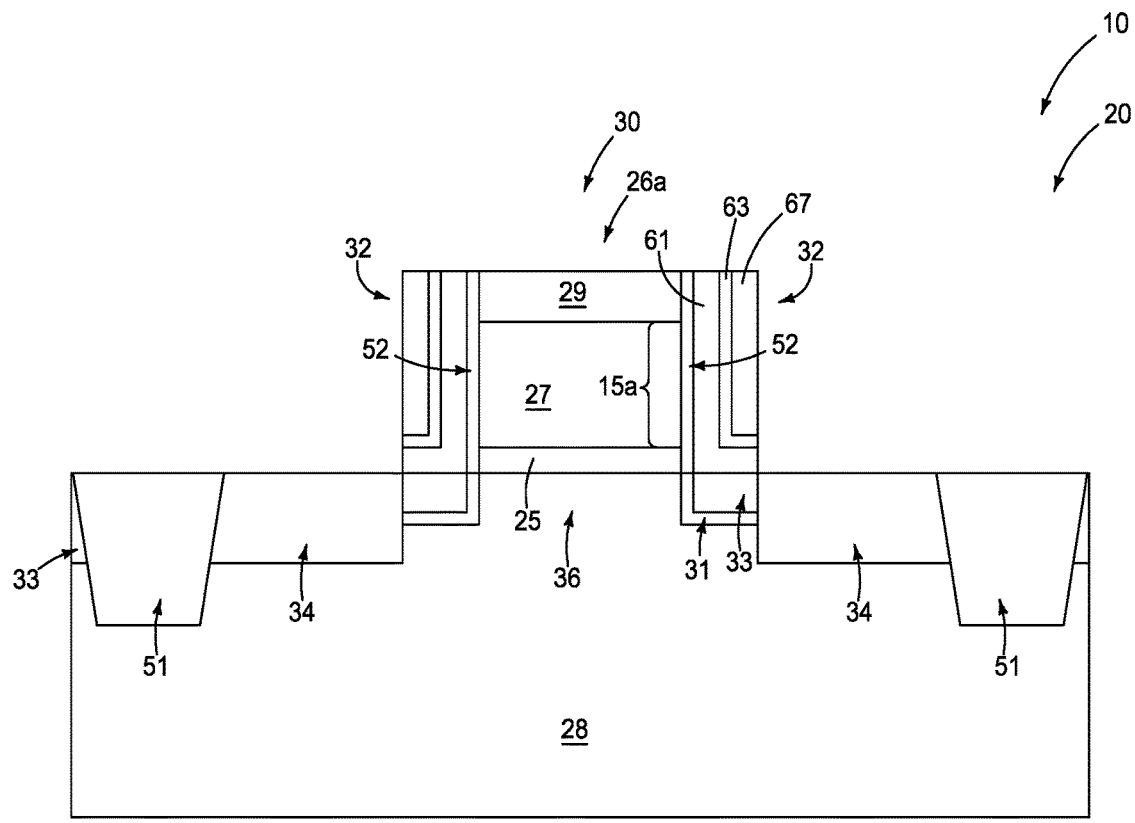
FIGS. 9A and 9B are diagrammatic cross-sectional side views of the regions of the integrated device of FIGS. 3A and 3B at an example process stage subsequent to that of FIGS. 8A and 8B.
Figure 9B:
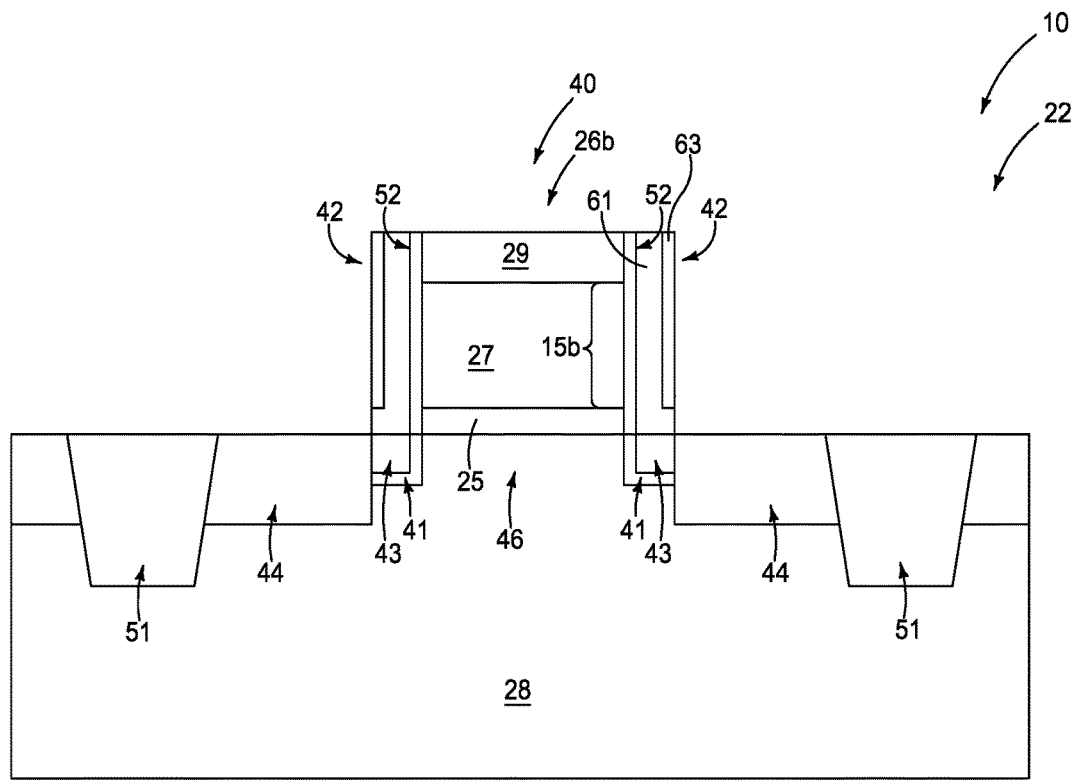

Referring to FIGS. 9A and 9B, the first spacers 32 and the first gate stack 26a are utilized as a mask during an implant of the first source/drain regions 34 into the base 28, and the second spacers 42 and the second gate stack 26b are utilized as a mask during an implant of the second source/drain regions 44 into the base 28.

The configuration of FIG. 9A comprises a transistor 30 analogous to that described above with reference to FIG. 2A. Such transistor has the source/drain regions 34 gatedly coupled to one another through a channel region 36; with electrical flow along the channel region 36 being selectively controlled through operation of the transistor gate 15a.

The configuration of FIG. 9B comprises a transistor 40 analogous to that described above with reference to FIG. 2B. Such transistor has the source/drain regions 44 gatedly coupled to one another through a channel region 46; with electrical flow along the channel region 46 being selectively controlled through operation of the transistor gate 15b.

Figure 9C:
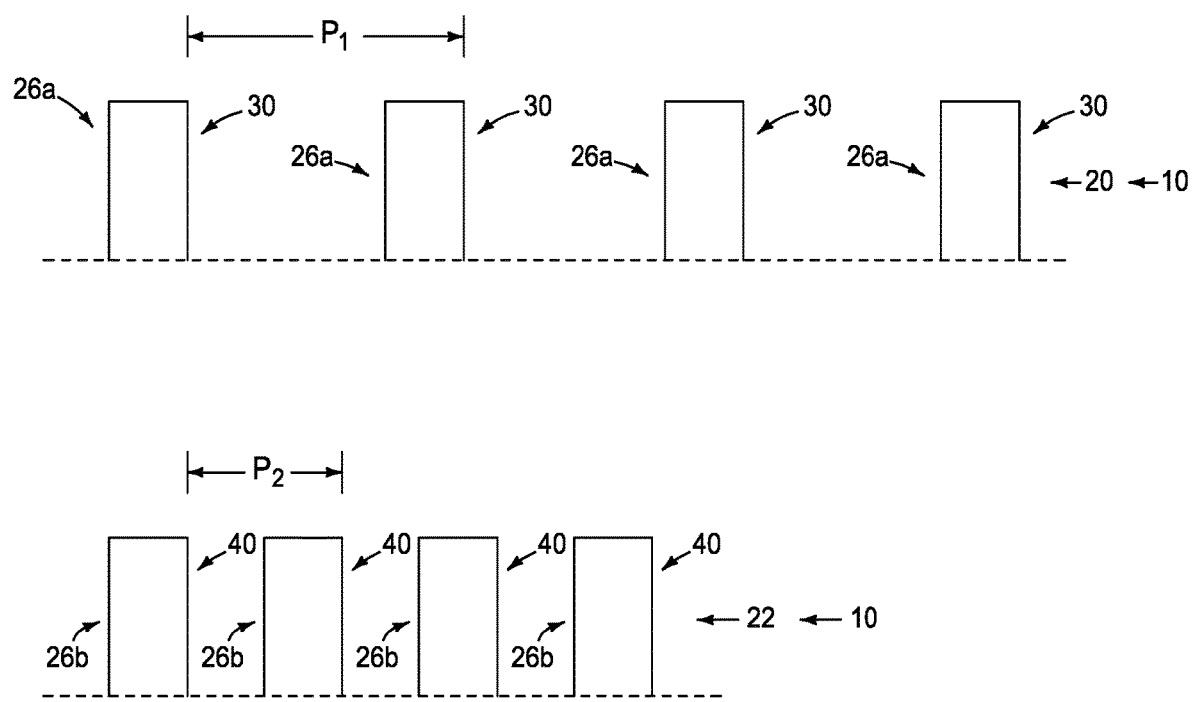
FIG. 9C shows diagrammatic cross-sectional side views along two regions of an integrated device, and illustrates respective pitches associated with components within the regions.

The transistor 30 of FIG. 9A may be representative of a plurality of substantial identical transistors formed across the first region 20 (i.e., the Peri Device region of FIG. 1), with such first transistors being formed at a first pitch; and the transistor 40 of FIG. 9B may be representative of a plurality of substantial identical transistors formed across the second region 22 (i.e., the Pitch Device region of FIG. 1), with such second transistors being formed at a second pitch. The second pitch may be less than the first pitch so that the transistors 40 formed along the second region 22 are at a tighter pitch than are the transistors 30 formed along the first region 20. FIG. 9C diagrammatically illustrates an example relationship between the transistors 30 along the first region 20 of the integrated device 10, and the transistors 40 along the second region 22 of the integrated device 10. Specifically, the first transistors 30 are shown to be at a first pitch $P_1$ and the second transistors 40 are shown to be at a second pitch $P_2$ which is less than (i.e., tighter than) the first pitch $P_1$.

Figure 10A:
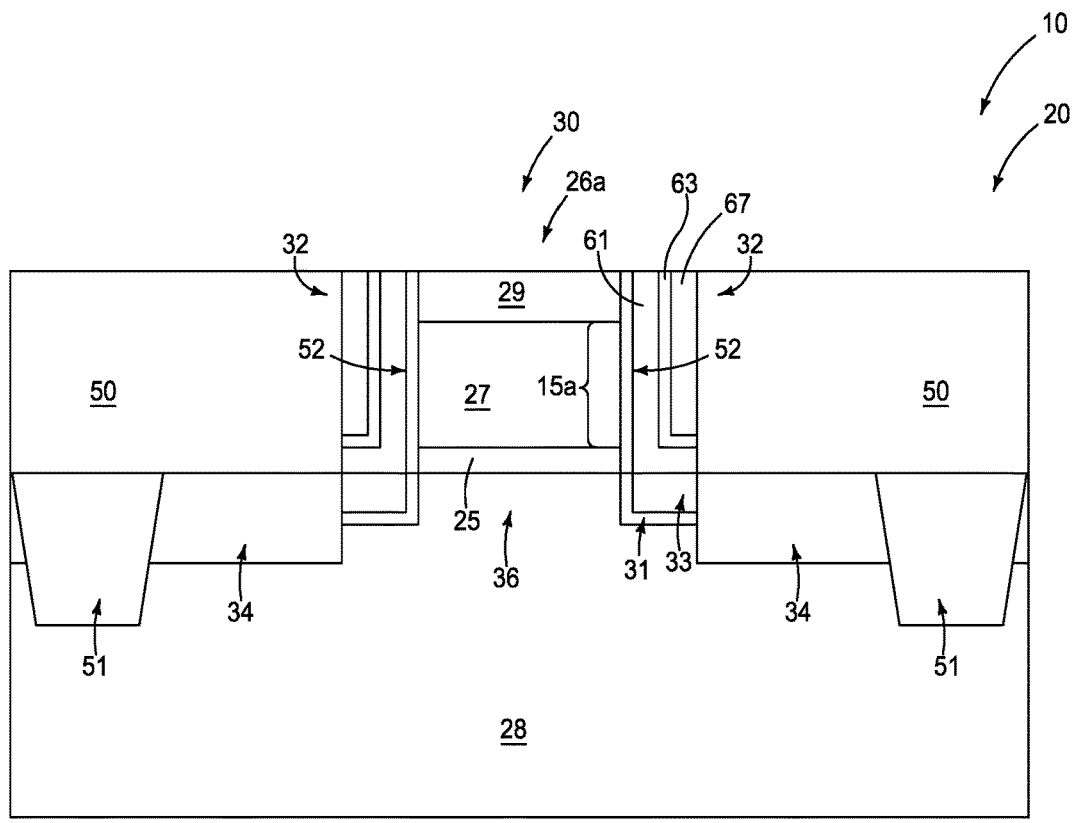
FIGS. 10A and 10B are diagrammatic cross-sectional side views of the regions of the integrated device of FIGS. 3A and 3B at an example process stage subsequent to that of FIGS. 9A and 9B.
Figure 10B:
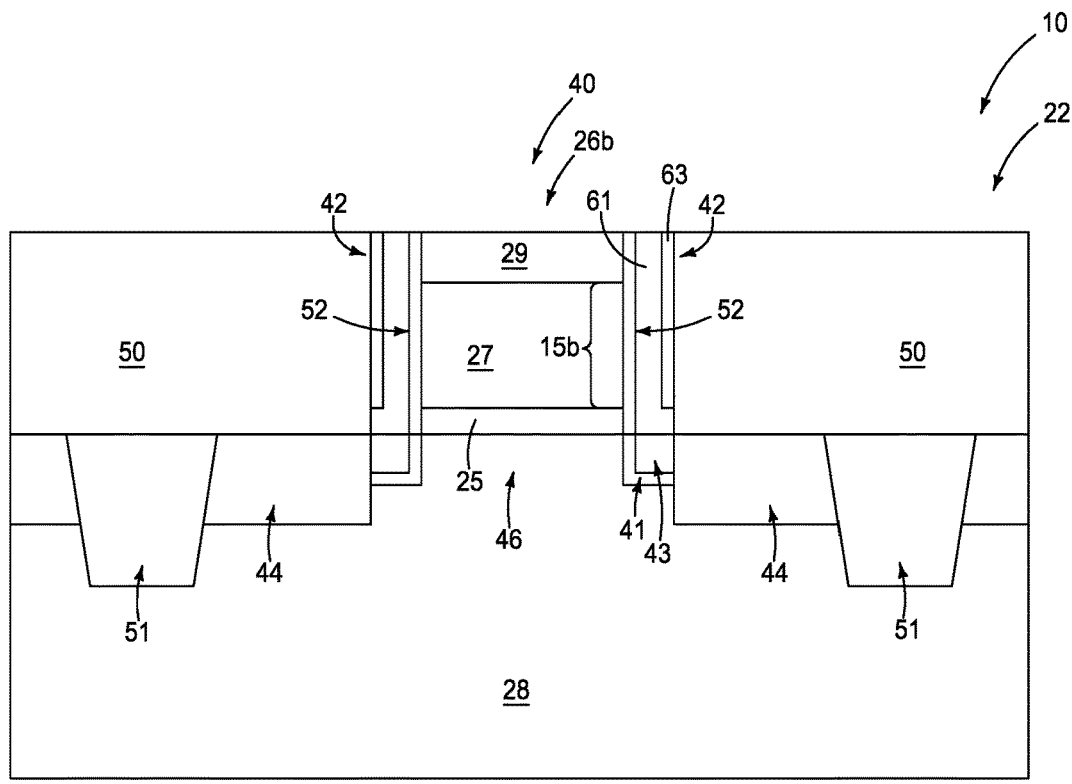

Referring to FIGS. 10A and 10B, the mass 50 is formed to be adjacent to the transistors 30 and 40, and to extend across the regions 20 and 22 of the integrated device 10. The mass 50 may comprise, consist essentially of, or consist of silicon dioxide. In some embodiments, a liner of silicon nitride may be formed over the semiconductor base 28, and along the gate stacks 26a and 26b, prior to forming the insulative mass 50. In some embodiments, the mass 50 may be referred to as an inter-layer dielectric (IDL). In some embodiments, the mass 50 may be initially formed to extend over the gate stacks 26a and 26b, and may then be subjected to planarization (e.g., chemical-mechanical polishing, CMP) to form the illustrated configuration of FIGS. 10A and 10B.

Figure 11A:
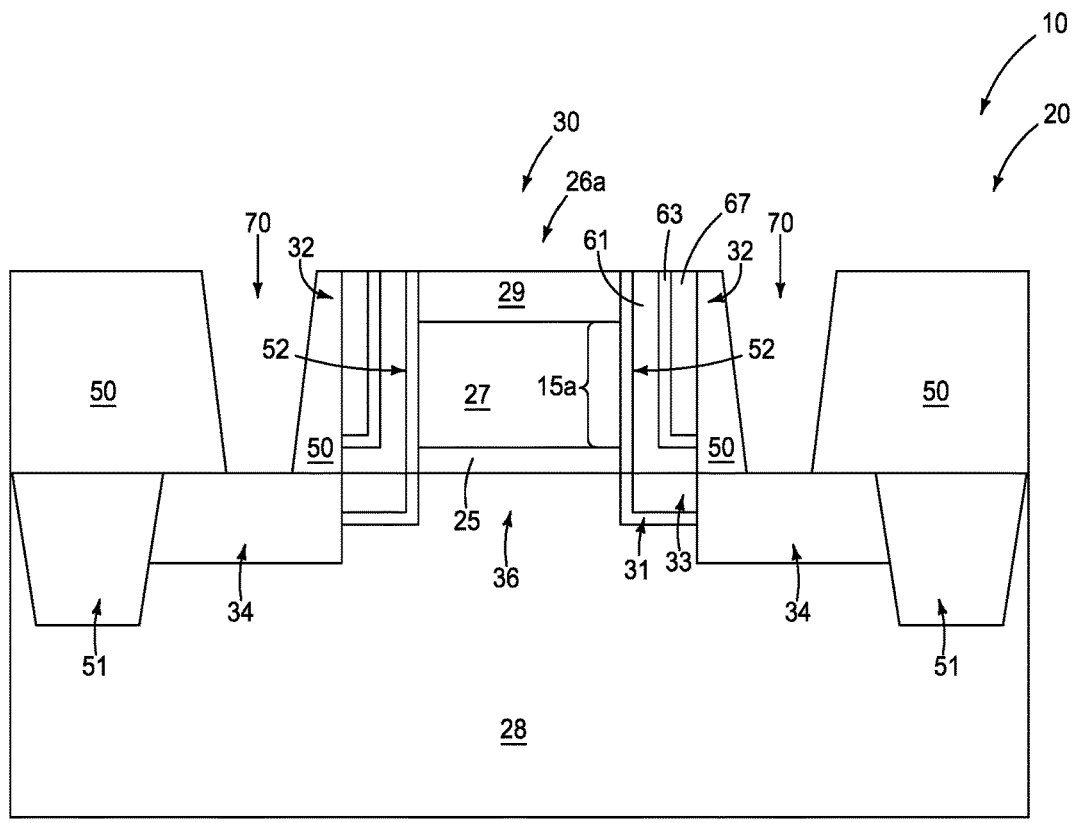
FIGS. 11A and 11B are diagrammatic cross-sectional side views of the regions of the integrated device of FIGS. 3A and 3B at an example process stage subsequent to that of FIGS. 10A and 10B.
Figure 11B:
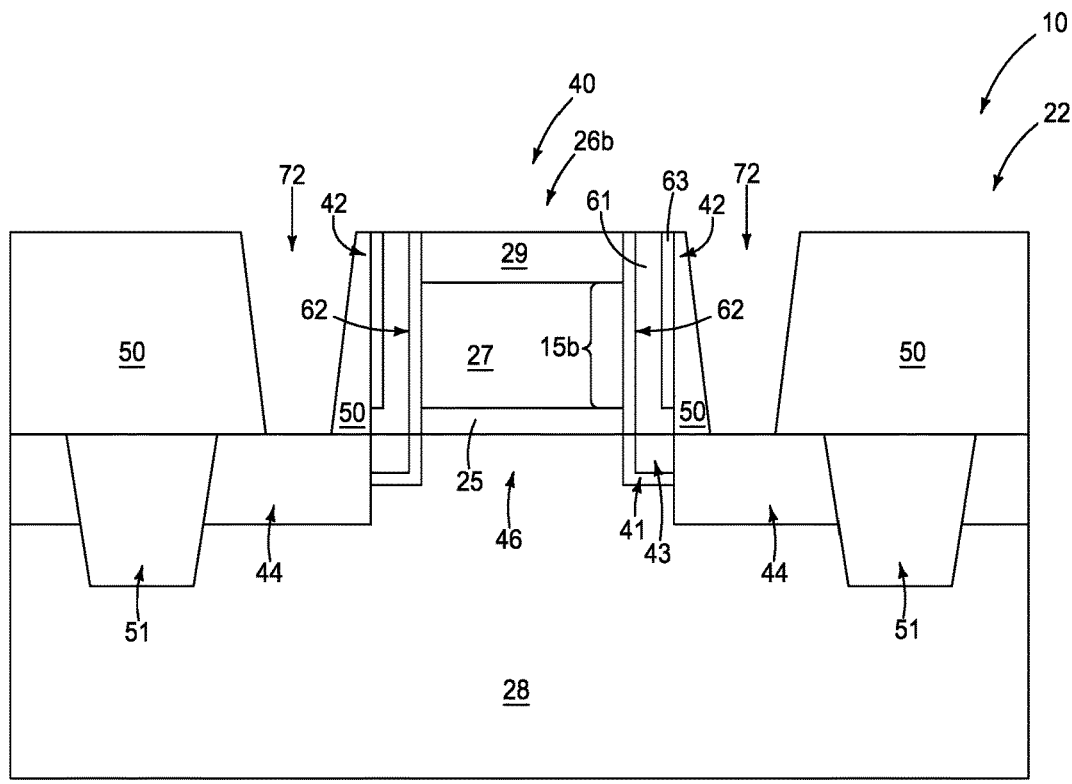

Referring to FIGS. 11A and 11B, first openings 70 are formed through the insulative mass 50 to expose the source/drain regions 34, and second openings 72 are formed through the insulative mass 50 to expose the source/drain regions 44.

Figure 12A:
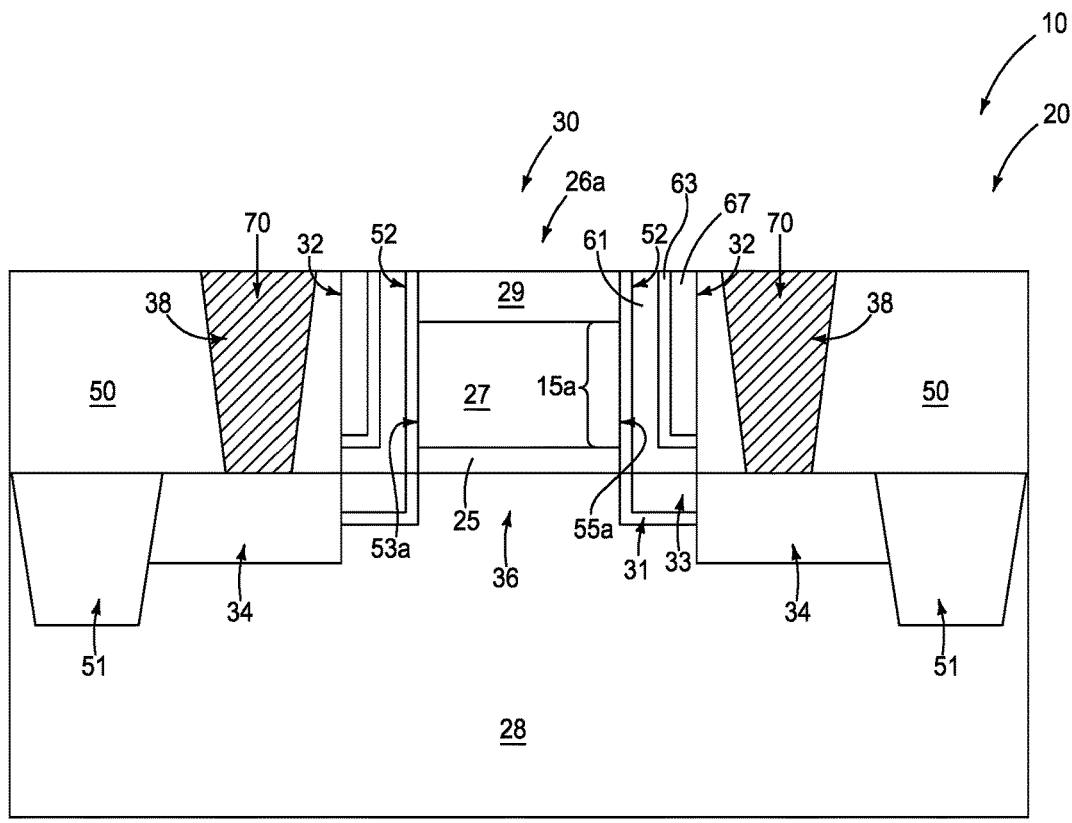
FIGS. 12A and 12B are diagrammatic cross-sectional side views of the regions of the integrated device of FIGS. 3A and 3B at an example process stage subsequent to that of FIGS. 11A and 11B.
Figure 12B:
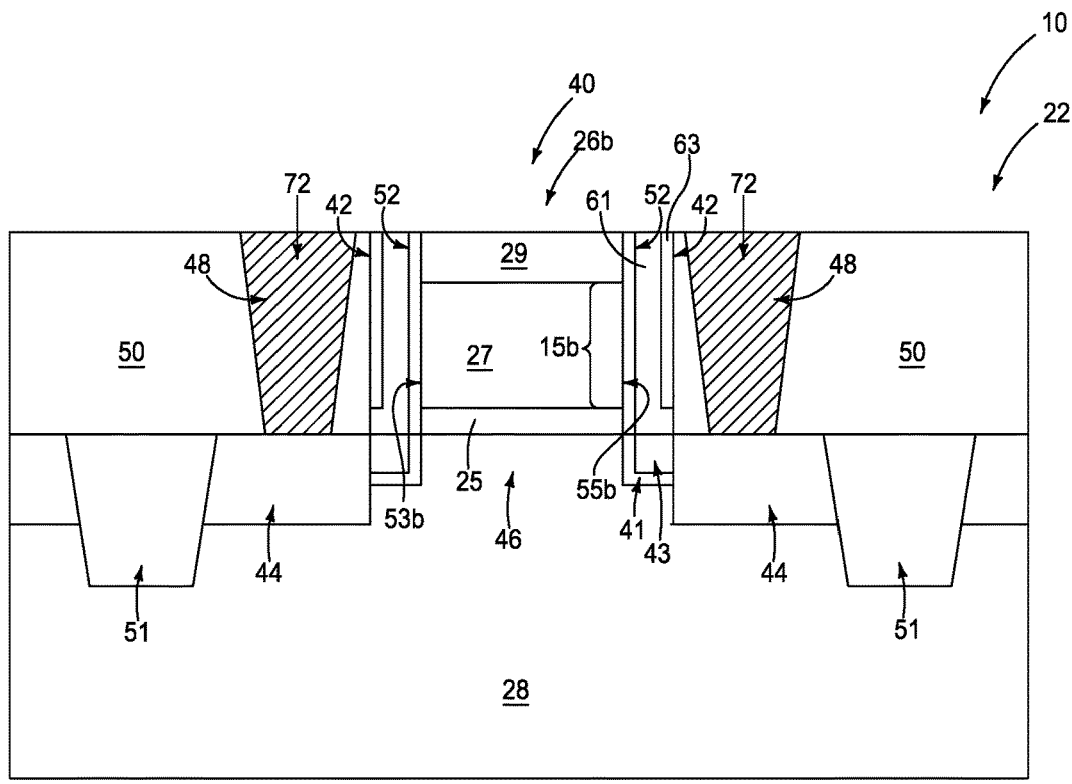

Referring to FIGS. 12A and 12B, the first and second interconnects 38 and 48 are formed within the first and second openings 70 and 72, respectively.

In some embodiments, the first transistor 30 of FIG. 12A may be associated with first circuitry (e.g., SWD circuitry) which is coupled with wordlines (e.g., the wordlines 16 of FIG. 1) that extend to a memory array associated with a third region of the integrated device 10 (e.g., the memory array 12 of FIG. 1).

In some embodiments, the second transistor 40 of FIG. 12B may be associated with second circuitry (e.g., SA circuitry) which is coupled with bitlines (e.g., the bitlines 18 of FIG. 1) that extend to the memory array associated with the third region of the integrated device 10 (e.g., the memory array 12 of FIG. 1).

In some embodiments, the first spacers 32 of FIG. 12A may be considered to be formed along the sidewalls 53a and 55a of the transistor gate 15a; with such spacers comprising the SiBNO of material 67, in addition to comprising the SiN of the protective liners 52, the SiBN of the material 61, and the SiN of the material 63. In such embodiments, the second spacers 42 of FIG. 12B may be considered to be formed along the sidewalls 53b and 55b of the transistor gate 15b; with such spacers not comprising the material 67, but instead only comprising the SiN of the protective liners 52, the SiBN of the material 61, and the SiN of the material 63.

In some embodiments, the protective liner 52 may be considered to correspond to a first layer of SiN along the transistor gates 15a and 15b, and the material 63 may be considered to correspond to a second layer of SiN along such transistor gates. The material 61 may be considered to be SiBN which is sandwiched between such first and second layers of SiN. The material 67 may be considered to be SiBNO which is outward of, and directly against, the second layer of the SiN of the first transistor 30.

In some embodiments, the first and second spacers 32 and 42 may each be considered to comprise multiple layers, and to comprise the same layers as one another except that the spacers 32 comprise an additional layer (the material 67) which is not present in the spacers 42. Such additional layer may comprise SiBNO in some embodiments.

The configurations of FIGS. 12A and 12B have halo regions and LDD regions (31, 33, 41 and 43) under the sidewall spacers 32 and 42. Such regions are optional, and in some embodiments one or more of the halo regions and LDD regions of FIGS. 12A and 12B may be omitted. Also, it is to be understood that other implant regions (not shown) may be provided in addition to, or alternatively to, the halo regions and LDD regions.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a method of forming an integrated device. A first transistor gate is formed over a first region of a semiconductor base. A second transistor gate is formed over a second region of the semiconductor base. A multilayer assembly is formed to extend across the first and second regions of the semiconductor base. A first portion of the multilayer assembly is across the first region and is over the first transistor gate. A second portion of the multilayer assembly is across the second region and is over the second transistor gate. A protective material is formed over the first portion of the multilayer assembly while leaving the second portion of the multilayer assembly exposed. An outer layer of the multilayer assembly is removed from the exposed second portion to thin the second portion of the multilayer assembly. The first portion of the multilayer assembly is anisotropically etched to form first sidewall spacers along the first transistor gate. The thinned second portion of the multilayer assembly is anisotropically etched to form second sidewall spacers along the second transistor gate. The first sidewall spacers and the first transistor gate are used as a mask during an implant of first source/drain regions into the first region of the semiconductor base. The first source/drain regions are gatedly coupled to one another through the first transistor gate. The second sidewall spacers and the second transistor gate are used as a mask during an implant of second source/drain regions into the second region of the semiconductor base. The second source/drain regions are gatedly coupled to one another through the second transistor gate.

Some embodiments include an integrated device having a transistor gate over a semiconductor base. Sidewall spacers are along sidewalls of the transistor gate. The sidewall spacers include SiBNO, where the chemical formula lists primary constituents rather than a specific stoichiometry. Source/drain regions are within the semiconductor base and are operatively proximate the first transistor gate.

Some embodiments include an integrated device having a first transistor gate over a first region of a semiconductor base, and having a second transistor gate over a second region of the semiconductor base. First sidewall spacers are along sidewalls of the first transistor gate. The first sidewall spacers include SiBNO, where the chemical formula lists primary constituents rather than a specific stoichiometry. The first sidewall spacers have a first thickness. Second sidewall spacers are along sidewalls of the second transistor gate. The second sidewall spacers have a second thickness which is less than the first thickness. First source/drain regions are within the semiconductor base and are operatively proximate the first transistor gate. Second source/drain regions are within the semiconductor base and are operatively proximate the second transistor gate.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A method of forming an integrated device, comprising:
    forming a first transistor gate over a first region of a semiconductor base, and forming a second transistor gate over a second region of the semiconductor base;
    forming a multilayer assembly to extend across the first and second regions of the semiconductor base; a first portion of the multilayer assembly being across the first region and over the first transistor gate and extending along sidewalls of the first transistor gate, and a second portion of the multilayer assembly being across the second region and over the second transistor gate and extending along sidewalls of the second transistor gate;
    forming a protective material over the first portion of the multilayer assembly while leaving the second portion of the multilayer assembly exposed;
    removing an outer layer of the multilayer assembly from the exposed second portion to thin the second portion of the multilayer assembly;
    anisotropically etching the first portion of the multilayer assembly to form first sidewall spacers along the first transistor gate;
    anisotropically etching the thinned second portion of the multilayer assembly to form second sidewall spacers along the second transistor gate;
    using the first sidewall spacers and the first transistor gate as a mask during an implant of first source/drain regions into the first region of the semiconductor base; the first source/drain regions being gatedly coupled to one another through the first transistor gate; and
    using the second sidewall spacers and the second transistor gate as a mask during an implant of second source/drain regions into the second region of the semiconductor base; the second source/drain regions being gatedly coupled to one another through the second transistor gate.

2. The method of claim 1 further comprising forming protective liners along sidewalls of the first and second transistor gates prior to forming the multilayer assembly.

3. The method of claim 2 wherein the protective liners comprise silicon nitride.

4. The method of claim 3 wherein the protective liners have thicknesses within a range of from about 8 nm to about 12 nm.

5. The method of claim 2 further comprising, after forming the protective liners, forming halo implant regions and/or LDD implant regions within the first region of the semiconductor base and operatively adjacent to the first transistor gate prior to forming the multilayer assembly.

6. The method of claim 2 further comprising, after forming the protective liners, forming halo implant regions and/or LDD implant regions within the second region of the semiconductor base and operatively adjacent to the second transistor gate prior to forming the multilayer assembly.

7. A method of forming an integrated device, comprising:
    forming a first transistor gate over a first region of a semiconductor base, and forming a second transistor gate over a second region of the semiconductor base;
    forming a multilayer assembly to extend across the first and second regions of the semiconductor base; a first portion of the multilayer assembly being across the first region and over the first transistor gate, and a second portion of the multilayer assembly being across the second region and over the second transistor gate;

forming a protective material over the first portion of the multilayer assembly while leaving the second portion of the multilayer assembly exposed;

removing an outer layer of the multilayer assembly from the exposed second portion to thin the second portion of the multilayer assembly;

anisotropically etching the first portion of the multilayer assembly to form first sidewall spacers along the first transistor gate;

anisotropically etching the thinned second portion of the multilayer assembly to form second sidewall spacers along the second transistor gate;

using the first sidewall spacers and the first transistor gate as a mask during an implant of first source/drain regions into the first region of the semiconductor base; the first source/drain regions being gatedly coupled to one another through the first transistor gate;

using the second sidewall spacers and the second transistor gate as a mask during an implant of second source/drain regions into the second region of the semiconductor base; the second source/drain regions being gatedly coupled to one another through the second transistor gate; wherein:

the multilayer assembly comprises SiBN over SiN, where the chemical formulas list primary constituents rather than specific stoichiometries;

the SiBN is the outer layer of the multilayer assembly; and the removing of the outer layer of the multilayer assembly comprises oxidizing the SiBN to SiBNO and then selectively removing the SiBNO relative to the SiN, where the chemical formulas list primary constituents rather than specific stoichiometries.

8. The method of claim 7 wherein the selective removal of the SiBNO utilizes hydrofluoric acid.

9. The method of claim 7 wherein the selective removal of the SiBNO utilizes a combination of sulfuric acid and hydrogen peroxide.

10. A method of forming an integrated device, comprising:

forming a first transistor gate over a first region of a semiconductor base, and forming a second transistor gate over a second region of the semiconductor base;

forming a multilayer assembly to extend across the first and second regions of the semiconductor base; a first portion of the multilayer assembly being across the first region and over the first transistor gate, and a second portion of the multilayer assembly being across the second region and over the second transistor gate;

forming a protective material over the first portion of the multilayer assembly while leaving the second portion of the multilayer assembly exposed;

removing an outer layer of the multilayer assembly from the exposed second portion to thin the second portion of the multilayer assembly;

anisotropically etching the first portion of the multilayer assembly to form first sidewall spacers along the first transistor gate;

anisotropically etching the thinned second portion of the multilayer assembly to form second sidewall spacers along the second transistor gate;

using the first sidewall spacers and the first transistor gate as a mask during an implant of first source/drain regions into the first region of the semiconductor base; the first source/drain regions being gatedly coupled to one another through the first transistor gate;

using the second sidewall spacers and the second transistor gate as a mask during an implant of second source/drain regions into the second region of the semiconductor base; the second source/drain regions being gatedly coupled to one another through the second transistor gate; wherein:

the multilayer assembly comprises a first layer, a second layer over the first layer, and a third layer over the second layer;

wherein the first, second and third layers comprise SiBN, SiN and SiBN, respectively, where the chemical formulas list primary constituents rather than specific stoichiometries;

the third layer is the outer layer of the multilayer assembly; and the removing of the outer layer of the multilayer assembly comprises oxidizing the SiBN of the third layer to SiBNO and then selectively removing the SiBNO relative to the SiN of the second layer, where the chemical formulas list primary constituents rather than specific stoichiometries.

11. The method of claim 10 wherein the second layer has a thickness less than or equal to about one-fifth of the thicknesses of the first and third layers.

12. The method of claim 10 wherein:

the first layer has a thickness within a range of from about 10 nm to about 20 nm;

the second layer has a thickness within a range of from about 1 nm to about 2 nm; and the third layer has a thickness within a range of from about 5 nm to about 12 nm.

13. The method of claim 1 wherein:

a first transistor comprises the first transistor gate and the first source/drain regions;

a second transistor comprises the second transistor gate and the second source/drain regions;

the first transistor is one of a plurality of substantially identical first transistors formed at a first pitch; and the second transistor is one of a plurality of substantially identical second transistors formed at a second pitch, with the second pitch being less than the first pitch.

14. The method of claim 13 wherein:

a memory array is over a third region of the semiconductor base;

the memory array has memory cells;

wordlines and bitlines extend across the memory array to address the memory cells;

the wordlines are coupled with first circuitry which comprises the first transistors; and the bitlines are coupled with second circuitry which comprises the second transistors.

* * * * *